(12) United States Patent
Tyler et al.

(10) Patent No.: US 7,036,100 B2
(45) Date of Patent: Apr. 25, 2006

(54) SYSTEM AND METHOD FOR DETERMINING TIMING CHARACTERISTICS OF A CIRCUIT DESIGN

(75) Inventors: Sean C. Tyler, Fort Collins, CO (US); Thomas A. Asprey, Boulder, CO (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 191 days.

(21) Appl. No.: 10/699,904

(22) Filed: Nov. 3, 2003

(65) Prior Publication Data

US 2005/0097486 A1    May 5, 2005

(51) Int. Cl.
   *G06F 17/50*    (2006.01)
(52) U.S. Cl. .................... 716/6; 716/4; 716/5
(58) Field of Classification Search .............. 716/4–6
   See application file for complete search history.

(56) References Cited

U.S. PATENT DOCUMENTS

| 5,210,700 | A |   | 5/1993 | Tom |
| 5,648,913 | A | * | 7/1997 | Bennett et al. ............ 716/6 |
| 5,740,347 | A | * | 4/1998 | Avidan .................... 714/33 |
| 6,112,022 | A | * | 8/2000 | Wei ........................ 703/14 |
| 6,158,022 | A | * | 12/2000 | Avidan .................... 714/33 |
| 6,581,197 | B1 | * | 6/2003 | Foutz et al. ............... 716/6 |
| 6,591,407 | B1 | * | 7/2003 | Kaufman et al. .......... 716/10 |
| 6,594,806 | B1 | * | 7/2003 | Casavant .................. 716/6 |
| 6,795,951 | B1 | * | 9/2004 | Hathaway et al. ......... 716/5 |
| 6,854,102 | B1 | * | 2/2005 | Maheshwari .............. 716/6 |

OTHER PUBLICATIONS

Foltin, M., et al., "Efficient Stimulus Independent Timing Abstraction Model Based on a New Concept of Circuit Block Transparency", DAC 2000, Jun. 10-14, 2002, p. 1-6.
McDonald, C., et al., "Timing Analysis for the PA-8000", http://www.eedesign.com/editorial/1997/coverstory9702.html Last Viewed Apr. 22, 2003, p. 1-9.
Hosegrahar, I., et al., "A Report of Static Timing Analysis", VLSI Design Automation (EE7V81), Summer 2001, p. 1-21.

* cited by examiner

*Primary Examiner*—Stacy A. Whitmore
*Assistant Examiner*—Naum Levin

(57) ABSTRACT

Systems and methods can be employed to determine one or more timing characteristics of a circuit design. In one embodiment, a system includes a calculator that provides an indication of slack for at least one node of a circuit design, the at least one node being capable of operating transparently and non-transparently. The indication of slack is determined based on a minimum of slack for paths that include the at least one node, regardless of path transparency.

37 Claims, 5 Drawing Sheets

SYSTEM AND METHOD FOR DETERMINING TIMING CHARACTERISTICS OF A CIRCUIT DESIGN

BACKGROUND

Various timing analysis tools, including for both static and dynamic timing analysis, have been developed for use in designing integrated circuits. Traditional tools perform timing analysis at selected points along paths in the circuits. Typically, such points in the path are evaluated to ascertain timing information about the stability of the path at such points.

One aspect of static timing analysis is to ascertain certain timing information known as slack. Slack generally corresponds to a measure of the difference between the expected arrival time and the actual arrival time of a signal at a point of a given path. For example, a positive slack number usually identifies by how much time a timing constraint has been met, whereas a negative slack number identifies an amount by which the timing constraint has been violated. Based on the results of timing analysis, including slack and other timing information, such as clock skew, a designer can implement changes in the circuit design.

SUMMARY

One embodiment of the present invention relates to a system that may comprise a calculator that provides an indication of slack for at least one node of a circuit design, the at least one node being capable of operating transparently and non-transparently. The indication of slack is determined based on a minimum of slack for paths that include the at least one node, regardless of path transparency.

Another embodiment of the present invention relates to a system to facilitate design of an integrated circuit. The system includes a path tracer that transparently traces paths associated with a given node of a circuit design. A calculator determines timing characteristics associated with the given node based on timing information for the traced paths. A minimum timing characteristic is selected from the timing characteristics determined for the traced paths associated with the given node.

Yet another embodiment of the present invention relates to a method that includes computing slack associated with a given node of a circuit design by analyzing each path associated with the given node transparently. The method also includes determining a potential slack value as a minimum of the computed slack associated with the given node.

Still another embodiment of the present invention relates to a method that includes determining a timing characteristic for a first path associated with a node of a given circuit design and determining the timing characteristic for at least a second path, regardless of path transparency. The second path includes the node, and at least a portion of the second path being capable of operating transparently and non-transparently. An indication of timing performance associated with the node is provided according to a minimum of the timing characteristic for a first path and the timing characteristic for at least a second downstream path.

DETAILED DESCRIPTION

This disclosure relates generally to systems and method for determining a timing characteristic, such as slack or clock skew at a node. Slack corresponds to the difference between the expected arrival time and the actual arrival time of a signal at a node (or point) of a given path. Clock skew relates to the difference in time that a clock signal takes to reach two different nodes.

A potential timing characteristic can be determined for a given node of a circuit design based on a minimum of at least two or more values of the timing characteristic associated with the given node. For example, the timing characteristic may be a slack value determined for one or more paths associated with the given node based on timing information, regardless of path transparency. The potential slack thus can provide an indication of downstream timing performance that can enable a designer to make informed decisions with respect to potential modifications to the circuit design. As a result, design and/or validation of an integrated circuit (IC) design can be facilitated.

Figure 1:
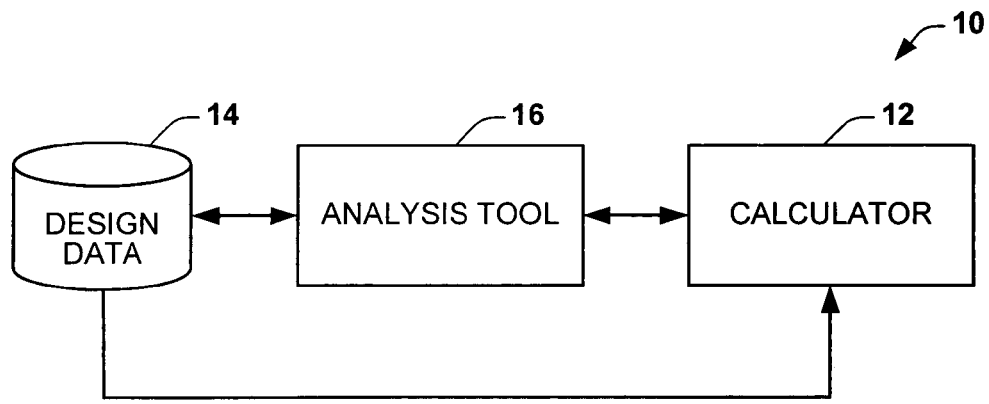
FIG. 1 depicts a block diagram of a system that can determine a timing characteristic.

FIG. 1 depicts an example of a system 10 that implements a calculator 12 to compute a timing characteristic, such as slack or clock skew. The system 10 can be a computer, a server or some other computer readable medium that can execute computer readable instructions. For example, the components of the system 10 can be computer executable components, such as can be stored in a desired storage medium (e.g., random access memory, a hard disk drive, CD ROM, and the like), computer executable components running on a computer or a design tool.

The calculator 12 determines a timing characteristic associated with an IC design, as described by design data 14. The timing characteristic determination enables a user to facilitate design convergence and/or validation of the IC design, as described herein. The design data 14, for example, can include a netlist that identifies connectivity and circuit parameters for the individual components of the design. As used herein, a component can be any identifiable unit of a circuit design, such as a transistor, a gate or a cell, as well as a collection of gates. The design data 14 can also include design parasitic data, time constraints and other circuit parameters for a given circuit design.

An analysis tool 16 performs timing analysis based on the design data 14. For instance, the analysis tool 16 can be a static timing analysis tool (e.g., computer executable instructions running on a computer) that provides timing information associated with operation of selected nodes in the circuit design. In general, a node can be any unit or a collection of units arranged to form one or more paths of the circuit design. A given node, for example, can be a logic element, a collection of logic components that cooperate to implement a desired logic function, or a port or interconnection associated with a logic element.

The circuit design can be formed of latches arranged in one or more paths. As used herein, a latch generally refers to any clock controlled circuitry capable of operating in a transparent state and a non-transparent state according to a clock signal (e.g., transparent when the clock signal is high, and non-transparent when the clock signal is low). The latches in a given path, for example, may be controlled by employing two phase clocking. Two phase clocking affords cycle stealing between latches since adjacent pairs of latches arranged along a given path are clocked by alternating clock signals (e.g., CK and NCK). Data paths (e.g., combinational logic) may be positioned between adjacent pairs of latches. Each of the latches in a given path as well as the data paths between latches provide corresponding amounts of delay during circuit operation, generally depending on the parameters of the components in the circuit design.

The analysis tool 16 is operative to perform circuit analysis on the design provided by the design data 14. The analysis tool 16, for example, can be a static timing analysis tool (e.g., PATHMILL® or PRIMETIME® available from Synopsys, Inc.) These and other timing analysis tools can provide for timing verification based on corresponding stimulus utilized by the analysis tool 16. The timing analysis tool 16 generates timing information, which is utilized by the calculator 12. The timing information, for example, includes timing data (e.g., delay times) associated with specific design instances of the design provided by the design data 14. The timing data can include node-level timing characteristics for voltages at each or at least a selected plurality of the nodes in the circuit design. The calculator 12 employs the timing information to determine a timing characteristic (e.g., potential slack) for one or more of the nodes of the circuit design. For example, potential slack provides an indication of path performance at such one or more nodes.

By way of example, the calculator 12 employs the timing data to determine a slack value associated with an input of at least one node of the circuit design. The calculator 12 also determines slack associated with one or more paths that include the node. The slack associated with each such path may be computed regardless of the path transparency. In one particular embodiment, the calculator 12 is operative to compute slack associated with a path based on timing information when the path is not transparent. A path may be considered not transparent when a signal arrives early at an input of a node that is part of the path (e.g., a signal arrives prior to latch activation). An indication of the minimum slack associated with the node can then be provided as the potential slack for such node. The calculator 12 can perform similar slack calculations to ascertain potential slack with respect to each node of the circuit design, for example, by analyzing each path associated with each node transparently.

The potential slack values for such nodes can be employed by a designer to facilitate implementing a given design. For example, because potential slack is determined by analyzing paths transparently, even if the path is not transparent, the designer achieves improved downstream visibility. This promotes an understanding of circuit limitations from a timing perspective. As a result, possible false impressions of slack associated with a given node in a circuit design can be mitigated, which may facilitate design convergence.

Figure 2:
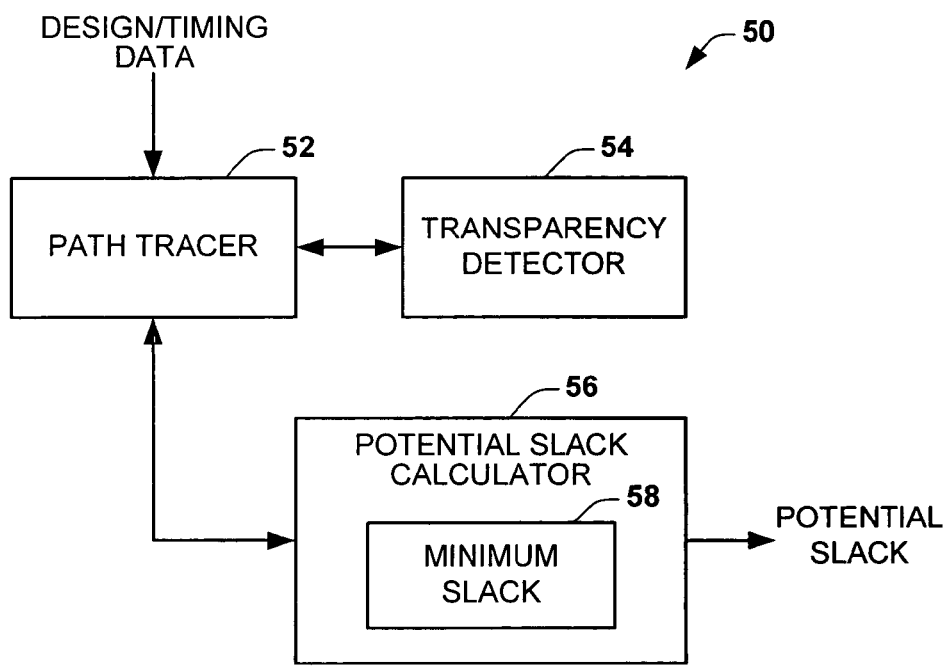
FIG. 2 depicts a block diagram of a slack calculation system.

FIG. 2 depicts an example of a system 50 for determining slack. The system 50 can be implemented, for example, as computer executable instructions running in a computer or a design tool. The system 50 includes a path tracer 52 that is operative to trace through paths of a circuit design associated with a given node based on design/timing data. The design/timing data, for example, may contain circuit design information. The circuit design information can be stored in memory, such as a netlist of circuit components defining interconnectivity between components and associated operating parameters for a given design. Alternatively or additionally, the design/timing data can include timing information describing timing operating characteristics based on timing analysis performed on the circuit design. The path tracer 52 may trace corresponding paths associated with each of the possible nodes in the design.

A transparency detector 54 is associated with the path tracer 52. The transparency detector 54 can ascertain whether a given path (e.g., including nodes identified by the path tracer 52) is transparent or is non-transparent based on the operating parameters as well as based on the design/timing data. The timing data, for example, can include timing characteristics for respective components of the design and timing constraints for operation thereof. The timing data can be provided by an associated timing analysis tool, which can be separate from or integrated with the system 50.

The transparency detector 54 can provide information about whether a path is transparent or non-transparent to enable the path tracer 52 to trace through the paths of the circuit design, even if a path is non-transparent. In this way, paths can be traced by the path tracer 52 regardless of their transparency. The path tracer 52 provides path information to a potential slack calculator 56. The path tracer 52 can also provide timing information associated with such path based on the node/circuit information. Alternatively, the potential slack calculator 56 may receive or access desired timing information for each path independently. The potential slack calculator 56 can employ a minimum slack component 58 to ascertain an indication of a minimum slack value. The minimum slack component 58, for example, can compare the slack values relative to each other and provide a potential slack value based on the compared slack values for the paths associated with a given node, including transparent and non-transparent paths. A potential slack value thus can be determined for each node of each path of the circuit design, regardless of path transparency.

A path can be considered non-transparent, for example, when a signal arrives early at one or more nodes of such path. For instance, if a signal arrives at a latch prior to activating the latch, the signal may remain at the input of the latch until the latch is activated (e.g., by a gating or clock signal) to propagate the signal downstream. Absent determining slack for both transparent and non-transparent nodes, a false impression about the available slack could be perceived for such latch. The potential slack calculator 56 thus is able to provide useful estimates of timing information about paths in the circuit design to mitigate reliance on potentially faulty information. As a result, a designer can utilize the potential slack and make informed choices on timing parameters for the components of the IC design.

Figure 3:
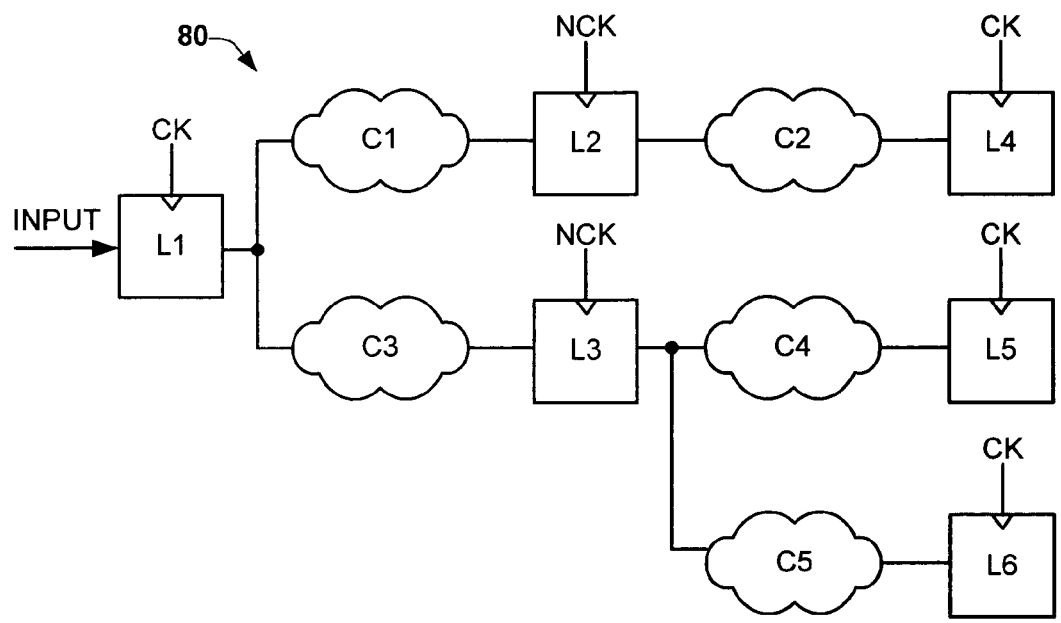
FIG. 3 depicts an example of a circuit representation for which slack can be determined.

FIG. 3 depicts a schematic representation of a circuit design 80 illustrating a downstream fanout relative to a node L1. The node L1 receives an INPUT signal at an input thereof to propagate a corresponding output signal downstream based on a clock (CK) signal. There are five paths in the design 80 that can be evaluated by traditional timing analysis, namely, paths L1–L2, L1–L3, L2–L4, L3–L5 and L3–L6. Depending on transparency of intermediate nodes, traditional timing analysis may also include three possible downstream paths, namely, paths L1–L2–L4, L1–L3–L5 and L1–L3–L6. Combinational logic path C1 is located between L1 and L2 and logic path C2 is located between L2 and L4. Combinational logic path C3 is located between L1 and L3, C4 is between L3 and L5 and C5 is between L3 and L6. Each of the logic paths C1–C5 can include any number of one or more logic elements or blocks configured to perform desired logic functions.

The nodes in the respective paths, for example, can be implemented as any circuitry (e.g., latches) capable of operating transparently and non-transparently, depending on the respective clock signal CK and NCK. In the example of FIG. 3, Latches are arranged in each path with the corresponding data paths located between adjacent pairs of latches, each of which may implement a corresponding amount of delay. A two phase clocking scheme can also be implemented in the design by employing alternating (e.g., substantially out-of-phase) clock signals, CK and NCK, to operate respective latches in each path. The two phase clocking scheme affords cycle stealing that can speed up operation of the circuit design.

By way of further example, the setup time (corresponding to slack) from timing analysis for L1–L2($S_{L1-L2}$) can be characterized as follows:

$$S_{L1-L2} = (D_{CK\uparrow-L1} + D_{L1-L2}) - D_{NCK\downarrow-L2} \quad \text{EQ. 1}$$

where:

$S_{L1-L2}$=setup time for path L1–L2;

$D_{CK\uparrow-L1}$=rising CK to L1 delay;

$D_{L1-L2}$=longest delay from L1–L2 (e.g., associated with logic block C1); and $D_{NCK\downarrow-L1}$=falling NCK to L2 delay.

If a transparent path exists for the path L1–L2–L4 (e.g., node L2 is transparent due to NCK being high), the setup time for such path can be expressed as follows:

$$S_{L1-L2-L4} = (D_{CK\uparrow-L1} + D_{L1-L2} + D_{L2-L4}) - D_{CK\downarrow-L4} \quad \text{EQ.2}$$

where $S_{L1-L2-L4}$=setup time for path L1–L4;

$D_{CK\uparrow-L1}$=rising CK to L1 delay;

$D_{L1-L2}$=longest delay from L1–L2; and $D_{L2-L4}$=longest delay form L2–L4;

$D_{CK\downarrow-L4}$=falling CK to L4 delay (e.g., occurs in cycle 2).

In one embodiment, potential slack can be calculated for each node in the circuit design 80, regardless of path transparency. Potential slack for a given node corresponds to a minimum slack value associated with such node. In order to ascertain a potential slack value for a given node, slack values are calculated for all possible paths associated with the given node, regardless of transparency, based on timing analysis results. For example, at node L2, the potential slack ($PS_{L2}$) can be expressed as the minimum slack value associated with L2, such as follows:

$$PS_{L2} = \min(S_{L1-L2}, S_{L1-L2-L4}) \quad \text{EQ. 3}$$

Similarly, the potential slack at node L3 can be expressed as follows:

$$PS_{L3} = \min(S_{L1-L3}, S_{L1-L3-L5}, S_{L1-L3-L6}) \quad \text{EQ. 4}$$

where:

$S_{L1-L3}$=setup time for path L1–L3;

$S_{L1-L3-L5}$=setup time for path L1–L3–L5; and $S_{L1-L3-L6}$=setup time for path L1–L3–L–6.

Those skilled in the art will understand that similar potential slack values can be determined for each node of the circuit design 80 (or any design) based on timing analysis results for such design. The potential slack values provide insight about the effects of downstream timing characteristics. As a result, a designer can utilize the potential slack and make informed choices on parameters for various components of the IC design which may improve overall design convergence. In the absence of determining potential slack, a designer might have false confidence about the available slack so that aggressive modifications based on traditional slack determinations might result in circuit failure.

Figure 4:
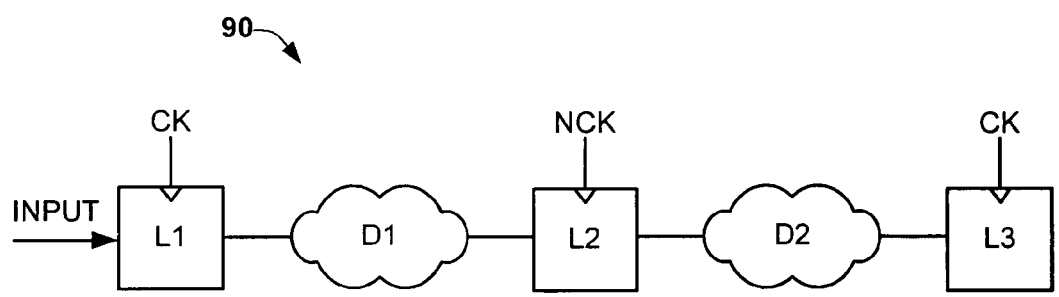
FIG. 4 depicts another example of a circuit representation for which slack can be determined.

By way of further example, FIG. 4 depicts a path 90 that will be used to demonstrate an example of a failure that might occur during a design process in the absence of determining potential slack. The path 90 includes nodes L1, L2 and L3 with logic networks, represented as delays D1 and D2, located between L1 and L2 and between L2 and L3. For purposes of simplification of explanation, it is assumed that delay associated with the each of the nodes L1-L3 is accounted for in the delays D1 and D2. It is to be understood and appreciated that the following example could be modified to explicitly define separate terms that include the delay associated with propagation of signals through the respective nodes.

Figure 5:
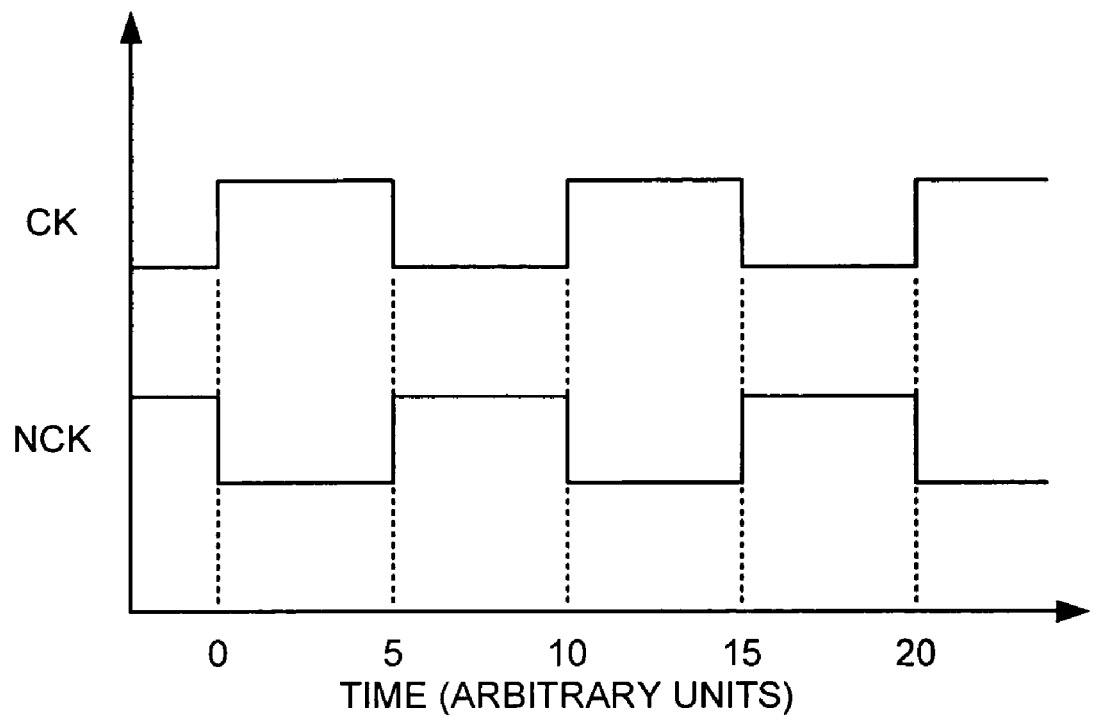
FIG. 5 depicts an example of a timing diagram for clock signals that may be employed in the circuit of FIG. 4.

An understanding of slack calculations for the path 90 will be considered based on supplying alternating clock signals CK and NCK to clock inputs identified on the respective nodes L1, L2 and L3. FIG. 5 illustrates examples of such clock signals as a function of time (e.g., using arbitrary units). Again, assuming that the delay associated with the operation of the latches L1 and L2 is included in D1, L1 opens at t=0 units and closes at t=5 units based on CK. Similarly, L2 opens at t=5 units and closes at t=10 units, and L3 opens at t=10 units and closes at t=15 units. The delay information can be obtained from timing analysis, for example, implemented using timing analysis tools, as identified herein. For purposes of the following examples, it is further assumed that the D1=3 units and D2=8 units. It will be appreciated that the particular amount of delay associated with the delay elements will vary according to the configuration and parameters of logic elements being implemented.

By way of example, traditional timing analysis for path 1 (e.g., CK→L1→D1→L2) provides a slack value (S1) that can be represented as follows:

S1=10−3=7 units.

For path 2 (e.g., NCK→L2→D2→L3), a corresponding slack value (S2) can be represented as follows:

S2=15−(5+8)=2 units.

Because the signal arrives at L2 prior to enabling L2 by NCK, L2 is non-transparent. Hence, no slack would be computed for a non-transparent path (path 3) through L2 (path 3=CK→L1→D1→L2→D2→L3) in traditional approaches. As a result, for the delays D1 and D2 in this example, the slack values S1 and S2 might lead a designer to believe that D1 can be increased by up to 7 additional units (e.g., up to D1=10 units), and the circuit will still work. This perception can be misleading, however.

For example, if D1 is increased by 5 units (i.e., change to D1=8 units), the slack S1 associated with path 1 becomes:

$$S1=10-8=2 \text{ units.}$$

The slack S2 remains unchanged, namely, S2=15−(5+8)=2 units. In this example, another path through node L2 (CK→L1→D1→L2→D2→L3) has a slack S3 that can be represented as follows:

$$S3=15-(8+8)=-1 \text{ units}$$

A negative slack corresponds to a failure that will require the designer to reduce D1 (e.g., by modifying circuit parameters associated with the logic network represented by D1) to some value less than D1=8 units.

Where potential slack is calculated as part of the design process, failures in the circuit design can be mitigated and, in turn, design convergence can be facilitated. The following example demonstrates a similar design process that can be implemented by employing potential slack calculations, as described herein. With reference to FIGS. 4 and 5, for example, it is assumed again that D1=3 units and D2=8 units. The slack S1 for path 1 can be represented as follows:

$$S1=10-3=7 \text{ units.}$$

For path 2 (e.g., NCK→L2→D2→L3), a corresponding slack value (S2) can be represented as follows:

$$S2=15-(5+8)=2 \text{ units.}$$

As noted above, path 3 corresponds to a nontransparent path through L2 (CK→L1→D1→L2→D2→L3) based on timing information obtained from timing analysis. The non-transparent path (path 3) will be traced through L2 to enable calculation of a corresponding slack S3, such as follows:

$$S3=15-(3+8)=4 \text{ units.}$$

According to one embodiment, the node L2 can be characterized as having a slack value that is the minimum of each path associated with L2, regardless of path transparency. In this example, the potential slack PS2 of L2 thus can be expressed as follows:

$$PS2=\min \text{ (Path 1, Path 3)}=4 \text{ units}$$

In view of the potential slack PS2, a designer has pertinent information indicating that D1 may be increased by up to 4 units (i.e., up to D1=7 units) without causing circuit failure. Thus, the potential slack can mitigate failures that might exist with traditional timing analysis techniques. Since the need to redesign circuit components can be reduced, the overall convergence of the circuit design can be facilitated.

Figure 6:
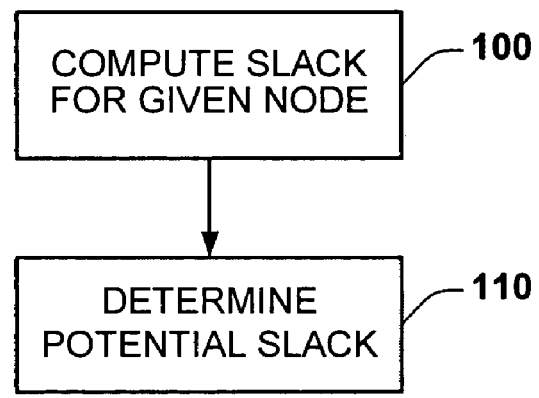
FIG. 6 is a flow diagram illustrating a method for determining a timing characteristic.
Figure 7:
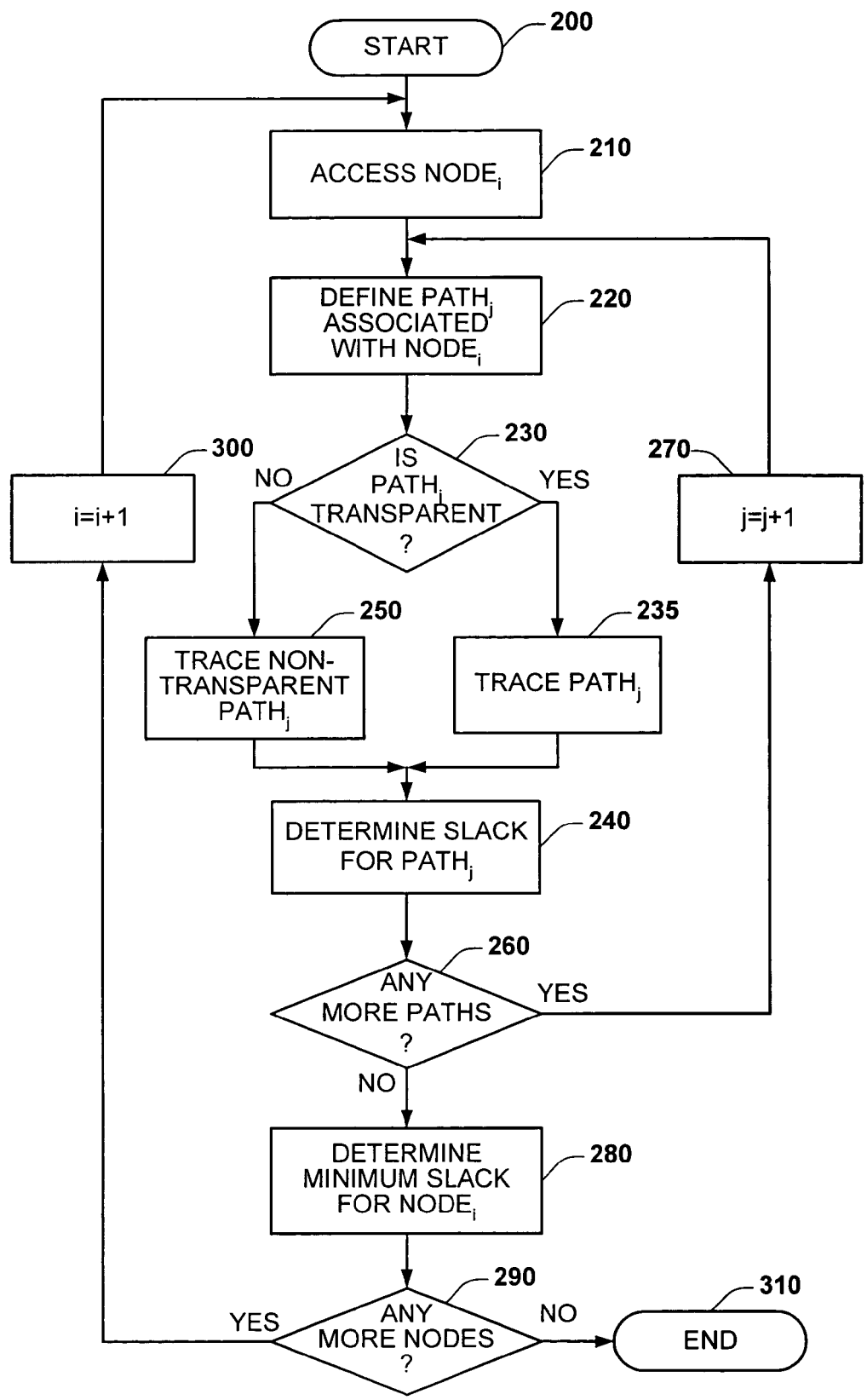
FIG. 7 is a flow diagram illustrating another method for determining a timing characteristic.
Figure 8:
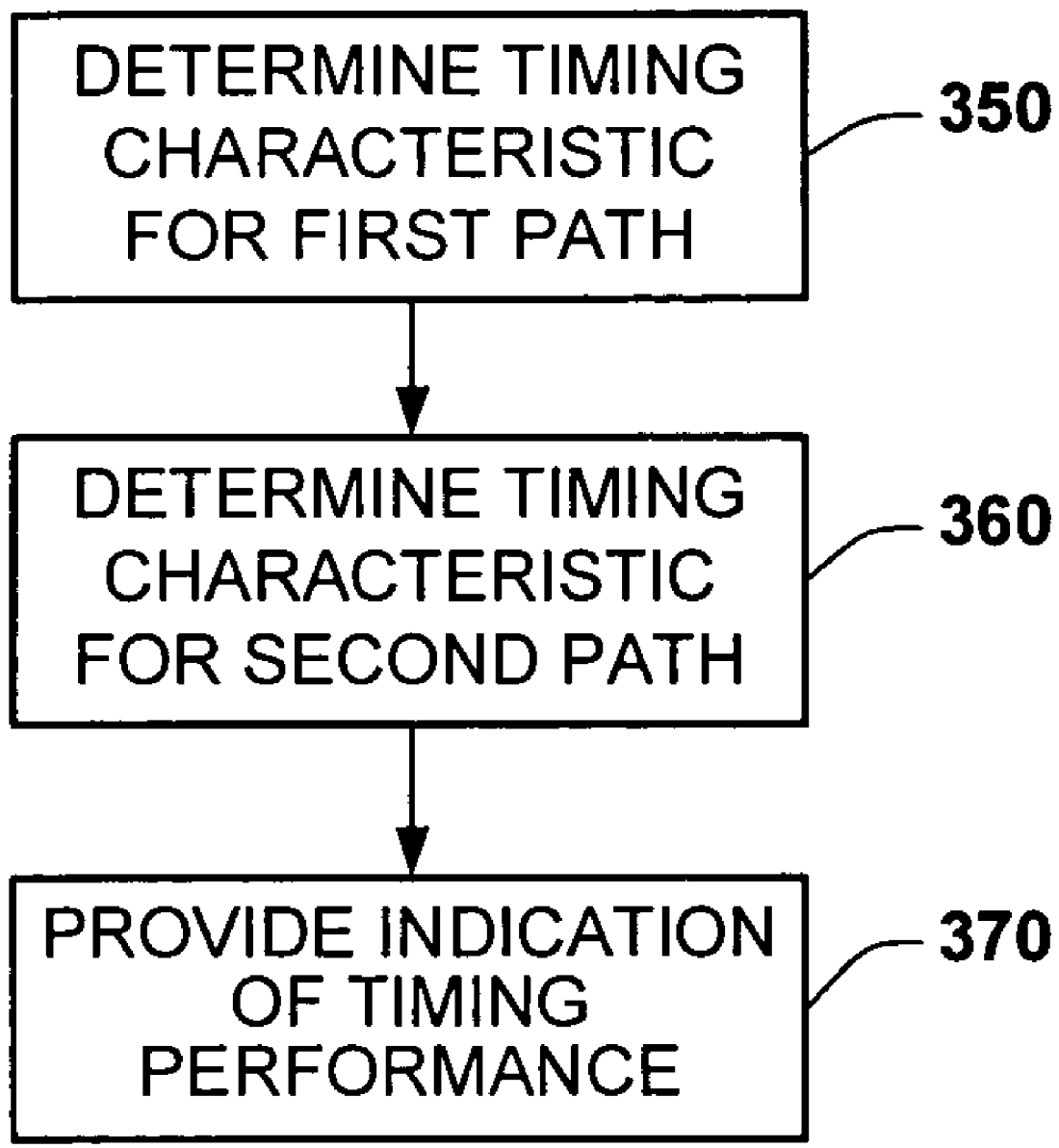
FIG. 8 is a flow diagram illustrating yet another method.

In view of the foregoing structural and functional features described above, certain methods that can be implemented will be better appreciated with reference to FIGS. 6, 7 and 8. While, for purposes of simplicity of explanation, the actions in FIGS. 6, 7 and 8 are shown and described as being implemented serially, it is to be understood and appreciated that the illustrated actions, in other embodiments, may occur in different orders and/or concurrently with other actions. Moreover, not all illustrated features may be required to implement a methodology. It is to be further understood that the following methodology can be implemented in hardware, software, or any combination thereof. For example, in one embodiment the methodologies can be implemented as computer executable instructions, such as can be stored in a desired storage medium (e.g., random access memory, a hard disk drive, CD ROM, and the like). In another embodiment, a methodology can be implemented as computer executable instructions running on a computer or design tool.

FIG. 6 depicts one embodiment of a computer-readable medium having computer-executable instructions for performing a method. The method can include computing slack associated with a given node of a circuit design by analyzing each path associated with the given node, regardless of path transparency, as shown at 100. The method also includes determining a potential slack value as a minimum of the computed slack associated with the given node, as shown at 110.

FIG. 7 depicts another embodiment of a method for determining a timing characteristic, such as of an integrated circuit design. The method begins at 200 such as in connection with activation of a program (or module) implementing the method (e.g., by a function call) to determine timing characteristics for a circuit design. This may be initiated, for example, after performing timing analysis with a timing analysis tool (e.g., PATHMILL® and PRIME-TIME® available from Synopsys, Inc.).

At 210, $NODE_i$ is accessed. The subscript "i" denotes an identifier for a given node for which method is being implemented. $NODE_i$ thus corresponds to a given node of a circuit design, which for the first iteration of the method corresponds to a starting node. A starting node can be any node at which an input signal can be received for processing. In one embodiment, the method is implemented for a circuit design that includes nodes implemented as latches or other circuitry capable of operating in both transparent and non-transparent states based on clock signals applied to control the nodes. For example, the nodes can be implemented as latches that are clocked by alternating clock signals (e.g., substantially 180° out of phase), such as to enable cycle stealing throughout the circuit design. The nodes can be spaced between blocks of combinational logic for propagating signals through such logic.

At 220, components of a $PATH_j$ associated with the $NODE_i$ are defined. The subscript "j" denotes a given path associated with the present $NODE_i$, where "j" is an integer greater than or equal to one. That is, the number of paths associated with the accessed $NODE_i$ generally will depend on the fanout of the circuit design relative to the $NODE_i$. At 230, a determination is made as to whether the $PATH_j$ is transparent. If $PATH_j$ is transparent, the transparent path can be traced at 235. The methodology proceeds to 240 in which slack for the traced $PATH_j$ is determined. In the event that $PATH_j$ is not transparent (NO), the methodology proceeds from 230 to 250. At 250, a non-transparent $PATH_j$ is traced. From 250, the method proceeds to 240 to determine slack for the non-transparent $PATH_j$. In this way, all potential paths, including those having one or more non-transparent components or nodes, are traced and defined to enable subsequent slack determinations.

As described herein, a non-transparency can exist when a signal arrives too early at an input of a given node (e.g., prior to activating a latch to its transparent state with a clock signal). At 260, a determination is made as to whether any additional paths are associated with $NODE_i$. If additional paths do exist (YES) the method proceeds to 270 in which the next $PATH_j$ is incremented (j=j+1). The foregoing actions from 220 to 260 can then be repeated for the next $PATH_j$. Where no additional paths are associated with $NODE_i$ (NO), the methodology proceeds to 280.

At 280, a minimum slack for $NODE_i$ is determined. The minimum slack for $NODE_i$ corresponds to the minimum slack value determined at 240 from the slack values for each of the paths associated with $NODE_i$. The minimum slack value can be utilized by a designer in connection with modifications to the circuit design, such as modifications to parameters of circuit components (e.g., upstream from $NODE_i$) in one or more of the paths associated with $NODE_i$. From 280 the methodology proceeds to 290.

At 290, a determination is made as to whether any additional nodes in the circuit design exist. If additional nodes do exist (YES), the methodology proceeds to 300. At 300, the next $NODE_i$ is accessed (e.g., i=i+1) for implementing actions similar to those just described with respect to 210–290. In this way, actual slack and potential slack values can be determined and utilized to ascertain a minimum slack value for each node of the circuit design to facilitate design modifications. Once no additional nodes exist at 290 (NO), the methodology ends at 310.

FIG. 8 depicts a method that includes determining a timing characteristic for a first path associated with a node of a given circuit design, as shown at 350. A timing characteristic is determined for at least a second path, regardless of path transparency, as shown at 360. The second path includes the node and at least a portion of the second path being capable of operating transparently and non-transparently. The method further includes providing an indication of timing performance associated with the node according to a minimum of the timing characteristic for a first path and the timing characteristic for at least a second downstream path, as shown at 370.

What have been described above are examples of the present invention. It is, of course, not possible to describe every conceivable combination of components or methodologies for purposes of describing the present invention, but one of ordinary skill in the art will recognize that many further combinations and permutations of the present invention are possible. For example, while much of the above description focuses on determining slack, it is to be understood that other timing characteristics (e.g., clock skew) can be determined based on the teachings contained herein. Accordingly, the present invention is intended to embrace all such alterations, modifications and variations that fall within the spirit and scope of the appended claims.

What is claimed is:

1. A system comprising:
a calculator that provides an indication of slack for at least one node of a circuit design, the at least one node being capable of operating transparently and non-transparently, the indication of slack being determined based on a minimum the slack value for paths that include the at least one node, regardless of path transparency.

2. The system of claim 1, wherein at least one path that includes the at least one node is a non-transparent path based on timing information for the at least one path.

3. The system of claim 1, wherein the at least one node further comprises at least one latch.

4. The system of claim 1, wherein the at least one node further comprises a plurality of latches arranged to define at least one path, alternating latches along the at least one path being clocked by substantially out-of-phase clock signals to propagate a signal along the at least one path.

5. The system of claim 4, wherein the at least one path has a non-transparency based on timing information for the circuit design.

6. The system of claim 5, wherein the at least one path has at least one non-transparent latch based on the timing information.

7. The system of claim 1, further comprising a path tracer that traces each path that includes the at least one node, regardless of path transparency, the calculator determining slack for the paths traced by the path tracer.

8. The system of claim 7, wherein the path tracer traces through a downstream portion of at least one path that includes the at least one node, regardless of transparency of the at least one node.

9. The system of claim 7, further comprising a potential slack calculator that ascertains a minimum slack value associated with the at least one node according to a minimum of the slack determined for the paths traced by the path tracer.

10. The system of claim 7, wherein at least one path through the at least one node operates non-transparently based on timing information provided by timing analysis for at least a portion of the circuit design.

11. The system of claim 1, further comprising a timing analysis system that provides timing information associated with circuit components for paths that include the at least one node, the slack calculator determining the indication of slack for the at least one node based on the timing information.

12. A computer implemented design tool comprising the system of claim 1.

13. A system to facilitate design of an integrated circuit, comprising:
a path tracer that traces paths associated with a given node of a circuit design, regardless of path transparency, the path tracer tracing an input path relative to the given node and at least one other path that includes the given node and a downstream portion relative to the given node; and
a calculator that determines slack characteristics associated with the traced paths associated with the given node based on timing information for the traced paths, a minimum slack characteristic being selected from the slack characteristics determined for the traced paths associated with the given node.

14. The system of claim 13, wherein the given node further comprises circuitry capable of operating transparently and non-transparently.

15. The system of claim 13, wherein at least one of the paths further comprises a plurality of latches arranged along the at least one of the paths, the plurality of latches being clocked by substantially out-of-phase clock signals to propagate a signal along the at least one of the paths.

16. The system of claim 13, wherein the at least one of the paths has a non-transparency according to corresponding timing information for the circuit design.

17. The system of claim 13, further comprising a potential slack calculator that determines a potential slack value as the minimum slack characteristic that is associated with the given node, according to the slack characteristics determined for each of the paths traced by the path tracer.

18. The system of claim 17, wherein at least one of the paths traced through the given node operates non-transparently based on the timing information.

19. The system of claim 13, further comprising a timing analysis system that provides the timing information associated with circuit components for the traced paths.

20. A system comprising:
means for tracing at least one path that includes a given node of a circuit design by analyzing the at least one path transparently, the given node being capable of operating transparently and non-transparently; and
means for determining potential slack for the given node, the potential slack corresponding to a minimum slack value determined from slack values associated with the given node, including a slack value associated with each of a plurality of paths that include the given node based on timing information for the plurality of paths.

21. The system of claim 20, further comprising means for determining slack for each of the paths traced by the means for tracing, the potential slack corresponding to minimum of the slack determined for paths traced by the means for tracing.

22. The system of claim 20, wherein the means for tracing is operative to trace each path associated with the given node regardless of path transparency.

23. The system of claim 22, further comprising means for determining slack for each of the paths traced by the means for tracing, the potential slack corresponding to minimum slack value from the slack determined for each of the paths traced by the means for tracing.

24. The system of claim 20, wherein the at least one of the paths further comprises plural means for latching an input signal from an input port to an output port based on a clock signal, the plural means for latching arranged along the at least one path such that adjacent pairs of the means for latching are activated to propagate a signal therethrough with substantially out-of-phase clock signals.

25. The system of claim 20, further comprising means for performing timing analysis on a circuit design that includes the at least one path to provide the timing information associated with circuit components for the at least one path.

26. A computer-readable medium having computer-executable instructions for performing a method comprising:
   computing slack associated with a given node of a circuit design by analyzing each path associated with the given node transparently; and
   determining a potential slack value as a minimum of the computed slack associated with the given node.

27. The computer-readable medium of claim 26, wherein the computing further comprises employing timing analysis information for the circuit design to compute the slack associated with the given node for each path associated with the given node.

28. The computer-readable medium of claim 26, wherein the given node is capable of operating transparently and non-transparently based on a control signal.

29. The computer-readable medium of claim 26, wherein at least one path associated with the given node comprises a plurality of latches arranged along the at least one path and being clocked by substantially out-of-phase clock signals for propagating a signal along the at least one path.

30. The computer-readable medium of claim 26, further comprising computer-executable instructions for tracing at least one path associated with the given node to enable a corresponding slack computation for the at least one path regardless of path transparency.

31. A method comprising:
   determining a slack characteristic for a first path associated with a node of a given circuit design;
   determining the slack characteristic for at least a second path, regardless of path transparency, the second path including the node and at least a portion of the second path being capable of operating transparently and non-transparently; and
   providing an indication of slack associated with the node according to a minimum of the slack characteristic for the first path and the slack characteristic for the at least a second path.

32. The method of claim 31, wherein at least one of the first and second paths is a non-transparent path based on timing information associated with the circuit design.

33. The method of claim 31, further comprising employing timing information obtained for the circuit design to compute each slack characteristic as a respective slack value associated with the given node for each path associated with the node.

34. The method of claim 33, further comprising tracing each path associated with the node transparently to enable a corresponding slack computation for each path associated with the node regardless of path transparency.

35. The method of claim 31, wherein the node comprises circuitry capable of operating transparently and non-transparently.

36. The method of claim 31, wherein at least one of the first and second paths associated with the node comprises a plurality of latches arranged along the respective path in which each adjacent pair of the plurality of latches along the respective path are clocked by substantially out-of-phase clock signals for propagating a signal along the respective path.

37. A computer-readable medium having computer-executable instructions for performing the method of claim 31.

* * * * *

UNITED STATES PATENT AND TRADEMARK OFFICE
CERTIFICATE OF CORRECTION

| | | |
|---|---|---|
| PATENT NO. | : 7,036,100 B2 | Page 1 of 1 |
| APPLICATION NO. | : 10/699904 | |
| DATED | : April 25, 2006 | |
| INVENTOR(S) | : Sean C. Tyler et al. | |

It is certified that error appears in the above-identified patent and that said Letters Patent is hereby corrected as shown below:

In column 5, line 46, after "L1-L2;" delete "and".

In column 5, line 47, after "L2-L4;" insert -- and --.

In column 9, line 48, in Claim 1, after "minimum" delete "the".

In column 10, line 52, in Claim 17, delete "node," and insert -- node --, therefor.

Signed and Sealed this

Twenty-first Day of April, 2009

JOHN DOLL
*Acting Director of the United States Patent and Trademark Office*